United States Patent
Di Martino et al.

(10) Patent No.: US 7,321,516 B2
(45) Date of Patent: Jan. 22, 2008

(54) BIASING STRUCTURE FOR ACCESSING SEMICONDUCTOR MEMORY CELL STORAGE ELEMENTS

(75) Inventors: Alberto Jose' Di Martino, Syracuse (IT); Enrico Castaldo, Catania (IT); Nicolas Demange, Maximin (FR); Daniele Salvatore Zompi, Misterbianco (IT)

(73) Assignee: STMicroelectronics, S.r.l. (IT)

( * ) Notice: Subject to any disclaimer, the term of this patent is extended or adjusted under 35 U.S.C. 154(b) by 416 days.

(21) Appl. No.: 11/063,651

(22) Filed: Feb. 22, 2005

(65) Prior Publication Data
US 2005/0195637 A1 Sep. 8, 2005

(30) Foreign Application Priority Data
Feb. 19, 2004 (EP) ................... 04290446

(51) Int. Cl.
*G11C 15/00* (2006.01)
(52) U.S. Cl. ................. 365/189.09; 365/189.05; 365/49
(58) Field of Classification Search .......... 365/189.09, 365/49, 189.05, 211
See application file for complete search history.

(56) References Cited

U.S. PATENT DOCUMENTS

| | | | |
|---|---|---|---|
| 5,561,621 A | 10/1996 | Devin et al. | |
| 5,729,162 A | 3/1998 | Rouy | |
| 6,002,276 A | 12/1999 | Wu | |
| 6,031,780 A * | 2/2000 | Abe | 365/227 |
| 6,198,670 B1 * | 3/2001 | Marr | 365/189.09 |
| 6,420,932 B1 | 7/2002 | Casper | |
| 6,560,152 B1 * | 5/2003 | Cernea | 365/211 |
| 6,721,211 B2 * | 4/2004 | Lee et al. | 365/189.09 |

FOREIGN PATENT DOCUMENTS

| | | |
|---|---|---|
| EP | 0 464 926 A2 | 1/1992 |
| EP | 1 058 270 A1 | 12/2000 |

OTHER PUBLICATIONS

European Search Report for EP 04 29 0446 dated Sep. 14, 2004.

* cited by examiner

*Primary Examiner*—Richard Elms
*Assistant Examiner*—Toan Le
(74) *Attorney, Agent, or Firm*—Lisa K. Jorgenson; Graybeal Jackson Haley; Paul F. Rusyn

(57) ABSTRACT

A biasing structure for a memory cell storage element, for setting an operating voltage at an accession electrode of the memory cell storage element. The biasing structure includes a biasing transistor coupled to the accession electrode and adapted to set the operating voltage based on a biasing voltage received at a control electrode of the biasing transistor, and a biasing voltage generator for generating the biasing voltage. The biasing voltage generator includes a feedback voltage regulation structure adapted track changes in a threshold voltage of the biasing transistor, so as to keep the operating voltage at the accession electrode of the memory cell storage element substantially stable against operating condition changes.

29 Claims, 4 Drawing Sheets

BIASING STRUCTURE FOR ACCESSING SEMICONDUCTOR MEMORY CELL STORAGE ELEMENTS

PRIORITY CLAIM

This application claims priority from European patent application No. 04290446.6, filed Feb. 19, 2004, which is incorporated herein by reference.

TECHNICAL FIELD

The present invention relates in general to the field of integrated circuits, and particularly to semiconductor memories. Specifically, the invention concerns a biasing structure for biasing memory cell storage elements, particularly but not limitatively electrically-programmable and non-volatile memory cells, in order to access the memory cell for performing operations such as reading out the memory cell content.

BACKGROUND

A wide class of electrically-programmable non-volatile semiconductor memories have memory cells exploiting as storage elements MOS transistors having a charge retention element such as a polysilicon floating gate or a nitride layer, which can be charged by e.g. injection or tunneling of electric charges (electrons), typically from the MOS transistor channel or drain region.

The amount of charge in the charge retention element affects the MOS transistor threshold voltage; this mechanism is exploited for storing information in the memory cell.

The information stored in a memory cell can be retrieved by determining the MOS transistor threshold voltage, for example by biasing the MOS transistor in a predetermined condition and sensing the current flowing therethrough.

Programming one such memory cell involves applying to the MOS transistor suitable programming potentials, in particular to the control gate and the drain electrodes thereof.

In general, the programming potentials are relatively high compared to the electric potentials (read potentials) that are applied to the transistor electrodes for reading the information stored therein.

Great care is however to be adopted in controlling the read potentials applied to the memory cell storage elements; in fact, if these potentials are too high, a spurious injection of charges into the MOS transistor's charge retention element may take place, which alter the amount of charge in the charge retention element and thus the MOS transistor threshold voltage; this effect, usually referred to as "soft" programming, may cause an initially non-programmed memory cell storage element to become programmed. If this occurs, the data stored in the memory cell, and thus in the memory device as a whole, are corrupted.

In particular, in order to avoid or at least limit the risk of soft programming, it is necessary to carefully control the memory cell storage element drain potential: if the drain potential is not sufficiently low, the memory cell storage element is said to experience a drain stress, and this may induce the injection and/or tunneling of charges into the charge retention element.

The effect of drain stress on soft programming is particularly felt when the memory cell undergoes a large number of read accesses, and/or when the read potentials are applied to the memory cell for a relatively long time.

Conventionally, a biasing transistor is placed in series with the memory cell storage element, having the function of biasing the drain of the storage element. The biasing transistor, typically an N-channel MOSFET, is controlled by a biasing voltage which, typically, is generated by means of a voltage partition from an initially higher voltage, which can be the supply voltage (VDD) of the memory device integrated circuit, or an internally-generated voltage higher than the supply voltage, generated on-chip by a charge-pump voltage booster. The voltage partition is typically achieved using a resistive voltage partitioner made up of a certain number diode-connected P-channel and N-channel MOSFETs connected in series to each other (the specific number of these transistors depending on several parameters such as the initial voltage, the target biasing voltage, the MOSFETs' threshold voltage and so on).

One such solution, in addition to being rather power consuming (a crowbar current flows through the voltage partitioner), has a very limited precision and does not guarantee that the storage element biasing voltage is sufficiently stable, depending on process parameters such as the MOSFETs' threshold voltages, and there is no control on the voltage thus generated.

In particular, no control is operated on the threshold voltage of the biasing MOSFETs, which as known is subject to changes due to process statistical parameter variations and operating temperature.

This limited stability and predictability of the memory cell storage element biasing voltage, and thus of the drain voltage of the storage element, is very undesirable: if the drain voltage rises too much, soft-programming becomes significant, while too low a drain voltage may impair the operation of the sensing circuits that have to sense the current sunk by the storage element.

SUMMARY

In view of the foregoing, an embodiment of the present invention is a biasing structure for a memory cell, particularly but not limitatively of the electrically programmable and non-volatile type such as an EPROM, an EEPROM or a flash memory cell, adapted to ensure that the memory cell is biased in a stable, reliable condition when access thereto is needed.

According to an aspect of the present invention, such an embodiment includes a biasing structure, for setting an operating voltage at an accession electrode of a memory cell storage element, such as a storage transistor as it is typical in semiconductor, non-volatile memories.

In summary, the biasing structure comprises a biasing transistor coupled to the accession electrode and adapted to set the operating voltage based on a biasing voltage received at a control electrode of the biasing transistor, and a biasing voltage generator for generating the biasing voltage.

The biasing voltage generator includes a feedback voltage regulation structure adapted to track changes in a threshold voltage of the biasing transistor, so as to keep the operating voltage at the accession electrode of the memory cell storage element substantially stable against operating condition changes.

BRIEF DESCRIPTION OF THE DRAWINGS

Features and advantages of the present invention will be made apparent by the following detailed description of an embodiment thereof, provided merely by way of non-limitative example, description that will be conducted making reference to the attached drawings, wherein.

DETAILED DESCRIPTION

Figure 1:
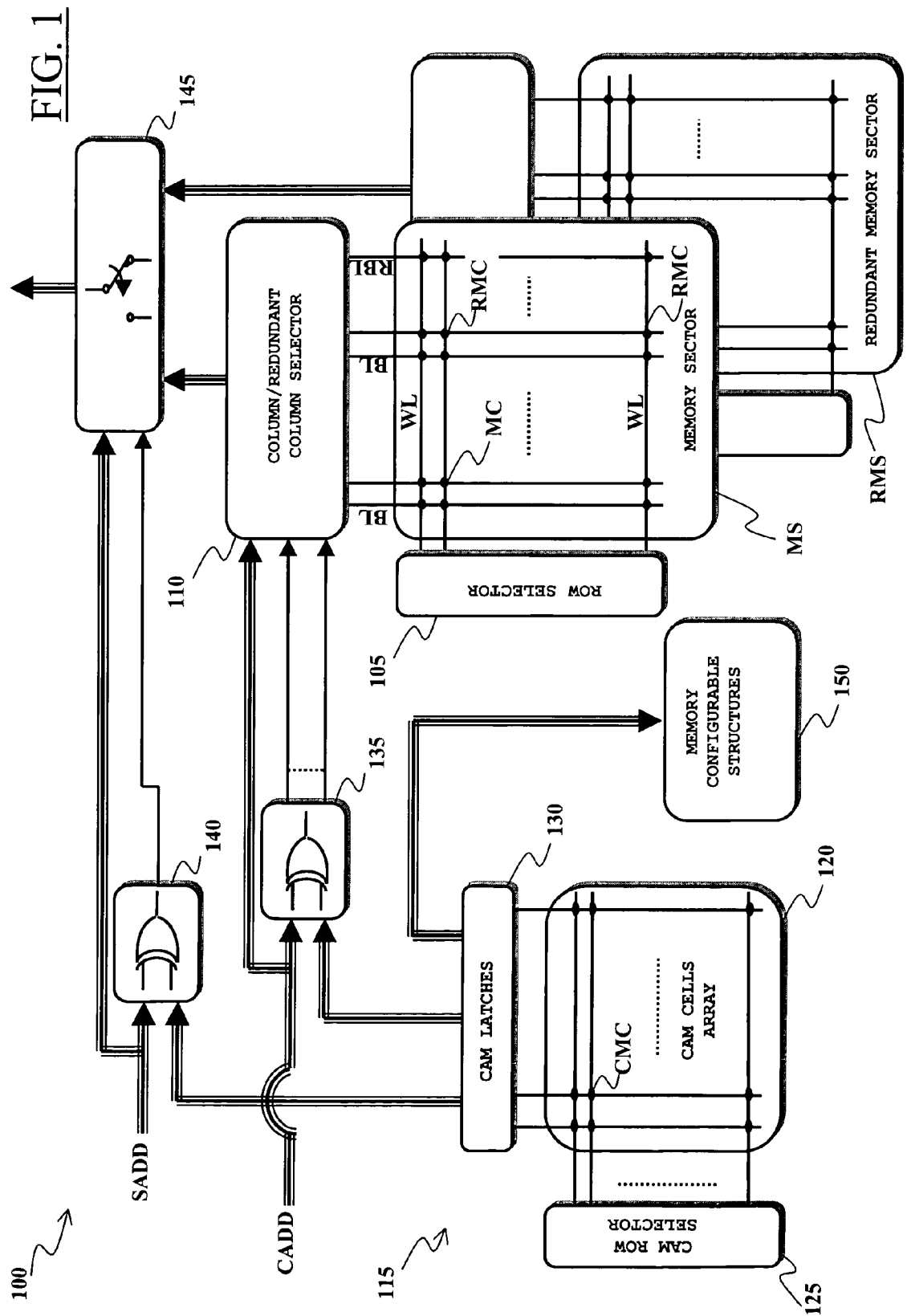
FIG. 1 shows a semiconductor memory device in which a memory cell biasing structure according to an embodiment of the present invention can be advantageously exploited.

With reference to the drawings, in FIG. 1 a semiconductor memory in which a biasing structure according to an embodiment of the present invention can be advantageously exploited is shown. The semiconductor memory is globally identified by 100 and is shown only schematically in terms of functional blocks, particularly those that are considered relevant to the understanding of the embodiment being described. The semiconductor memory 100 is for example a non-volatile, electrically-programmable memory such as a flash, and comprises a plurality of individually erasable sectors of memory cells or memory sectors, only one of which is shown in the drawing for simplicity and is identified by MS. Each memory sector includes a plurality of flash memory cells MC, schematically indicated in the drawing as dots, typically MOS transistors having a drain, a source, a control gate and a conductive-material (typically polysilicon) floating gate (albeit other memory cell structures are possible, for example memory cells formed by MOS transistors wherein instead of a polysilicon floating gate a silicon nitride charge-trapping layer is provided). The memory cells MC are conventionally arranged by rows and columns to form a two-dimensional array or matrix, and with each row and column there are respectively associated a respective word line WL and bit line BL. A row selector 105 and a column selector 110 are provided for selecting the matrix rows and columns, respectively, responsive to a row address (not shown in the drawing) and a column address CADD, part of an address code fed to the memory device 100.

In order to make the memory device 100 fault tolerant to a certain extent, a redundancy scheme is implemented. In essence, the provision of the redundancy scheme calls for having a certain number of additional (redundant) storage resources in addition to those (normal storage resources) strictly necessary for achieving the target memory storage capacity; the redundant storage resources are exploited for functionally replacing the normal storage resources in case of failure thereof, for example due to manufacturing defects. In the example shown in the drawing, each memory sector includes a prescribed number of redundant memory cells RMC, each one connected to a respective one of a plurality of redundant bit lines RBL. In this way, when a memory cell MC in one of the (normal) bit lines BL is defective, or in general when one of the (normal) bit lines BL is affected by a defect, the defect can be overcome by functionally replacing the (normal but defective) bit line BL with one of the redundant bit lines RBL. In addition to, or instead of the redundant bit lines RBL, redundant word lines might as well be provided in each memory sector. In the example shown in the drawing, a whole sector of redundant memory cells or redundant memory sector RMS is also provided for (with associated row and column selectors, similarly to the normal memory sector MS), adapted to functionally replace an entire memory sector such as the memory sector MS in case of defects that cannot be repaired by exploiting the redundant bit lines RBL.

The implementation of a redundancy scheme such as the exemplary one depicted in the drawing requires a so-called redundancy circuitry that, effectively, is capable of storing the addresses of the defective storage resources, and of detecting when access (in read, write or erase) to the defective storage resources is requested, so as to automatically (and transparently to the outside) divert the access request towards the redundant storage resources chosen to functionally replace the defective ones. A known and rather typical way of realizing the redundancy circuitry calls for integrating, along with the other memory device circuits, a Content Addressable Memory (CAM), such as the CAM 115 shown schematically in FIG. 1. In particular, the CAM 115 should be non-volatile, so as to retain the information stored therein even in absence of power supply (the information concerning the defective storage resources, normally detected during the integrated circuit post-manufacturing test phase, should not get lost) and programmable, preferably electrically programmable. The CAM 115 comprises an array 120 of CAM memory cells CMC, arranged by rows and columns, with a CAM row selector 125 for selecting the CAM rows, and, associated with the CAM cell columns, CAM latches 130 for latching the content of the accessed CAM cells. The CAM cells content (latched in the CAM latches 130) is supplied to comparison circuits, typically XOR circuits 135, 140 that compare the CAM cells content with a current column address CADD and a current memory sector address SADD (a part of the memory address that is used for selecting one memory sector among the plurality of memory sectors); in case the current column address CADD coincides with (one of) the defective column address(es) stored in the CAM 115 (i.e., in case the address of a defective bit line that has been functionally replaced by a redundant bit line), an output of the XOR circuit 135 is asserted, and causes the redundant bit line RBL to be accessed instead of the defective bit line BL. Similarly, in case the current memory sector address SADD coincides with the defective memory sector address stored in the CAM 115, an output of the XOR circuits 140 is asserted and causes the memory sector selector circuit 145 to select the redundant memory sector RMS instead of the defective memory sector.

In addition to storing the addresses of the defective storage resources for redundancy purposes, the CAM may be expediently exploited also for storing other data, such as memory configuration parameters for configuring memory device configurable structures, schematically shown as a block 150 (for example, the width of the memory word, in a memory design supporting both a byte-wide and a sixteen-bit wide memory word, or configuration data for trimming structures such as voltage partitioners and the like, and other possible configuration parameters).

Figure 2:
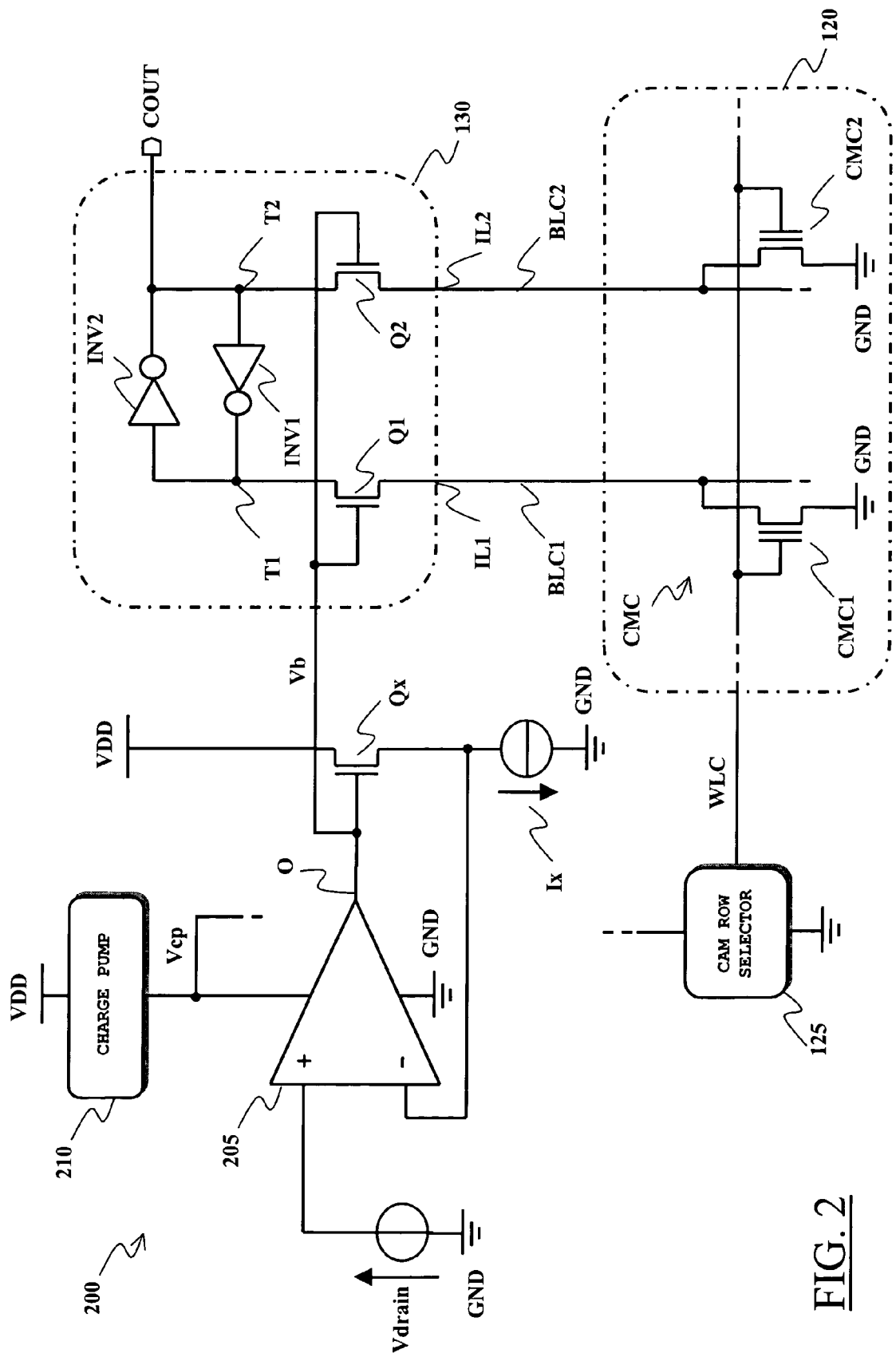
FIG. 2 is a partially schematic block and partially circuital diagram showing a biasing structure according to an embodiment of the present invention.

Referring now to FIG. 2, the structure of the CAM 115 is shown in greater detail; in particular, this drawing shows the structure of a generic CAM cell CMC, of an associated CAM latch 130, and a CAM cell biasing circuit 200 according to an embodiment of the present invention.

The generic CAM cell CMC includes a pair of storage units CMC1, CMC2, for example MOS transistors of the same type as those forming the memory cells MC and the redundant memory cells RMC, particularly (but not limitatively) floating-gate MOS transistors. The two MOS transistors CMC1, CMC2 are intended to be programmed in such a way as to store mutually opposite states: for example, in order to store a logic state "1" in the CAM cell CMC, the MOS transistor CMC1 stores a "1" (a condition conventionally corresponding to a low-threshold voltage or unprogrammed transistor state) and the MOS transistor CMC2 stores a "0" (a condition conventionally corresponding to a relatively high-threshold voltage or programmed transistor state), and, viceversa, in order to store a logic state "0" in the CAM cell CMC, the MOS transistor CMC1 stores a "0" and the MOS transistor CMC2 stores a "1". It is pointed out that this "differential" CAM cell structure is not at all limitative, and other structures are possible, in particular a structure of CAM cell including only one storage MOS transistor.

The two storage MOS transistors CMC1 and CMC2 have respective control gates connected to a same word line WLC of the CAM cell array 120 (associated with a CAM array row), and respective drain electrodes respectively connected to a first and a second bit lines BLC1 and BLC2 of the CAM cell array 120 (associated with a CAM array column). Source electrodes of the two storage MOS transistors CMC1 and CMC2 are connected to a reference voltage line (ground GND).

The first and second bit lines BLC1 and BLC2 are respectively connected to a first and a second inputs IL1, IL2 of the associated CAM latch 130. In series to each bit line BLC1, BLC2, a respective biasing transistor Q1, Q2 is provided, having the main function of biasing the drain electrode of the associated CAM cell storage MOS transistor CMC1, CMC2. In particular, the biasing transistors Q1 and Q2 are N-channel MOSFETs having a source connected to the respective input IL1, IL2, thus to the respective bit line BLC1, BLC2, a drain connected to a respective terminal T1, T2 of a structure essentially made up of a pair of (e.g., CMOS) inverters INV1, INV2 cross-connected to each other, and a gate connected to a biasing voltage line Vb. An output COUT of the cross-connected inverter structure, connected to the output of the inverter INV2 (but this is merely a matter of choice, being as well possible to connect the output to the output of the other inverter) forms the output of the CAM latch 130 and carries a logic state corresponding to the datum stored in the CAM cell CMC.

Similarly to the row selector 105 in the memory sector MS, in order to access the CAM cell CMC, the CAM row selector 125 biases the corresponding CAM word line WLC to a voltage that depends on the operation to be carried on the CAM 115; in particular, in order to program the CAM cell CMC, the potential of the CAM word line WLC is raised to a value sufficiently high (such as 9 V) to cause injection (or tunneling) of electrons into the floating gate, while in order to read the CAM cell content the potential of the CAM word line is brought to a lower value (e.g., 5 V or less) at least higher than the threshold voltage of the MOS transistors CMC1, CMC2 when not programmed; when the CAM word line WLC is not selected, the potential thereof is for example kept at ground.

The biasing transistors Q1 and Q2 serve for biasing the drain electrode of the associated CAM cell storage MOS transistor CMC1 and CMC2 to a voltage which should be sufficiently low not to significantly stress the drain of the MOS transistors CMC1 and CMC2; stressing (from an electrical viewpoint) the drain of the MOS transistors CMC1 and CMC2 is probably the main cause of the spurious programming of the MOS transistors CMC1 and CMC2 even if such transistors are not submitted to the programming voltages (which are relatively high compared to the read voltages), a phenomenon called "soft programming". The drain voltage of the MOS transistor CMC1 and CMC2 should also be sufficiently stable against operating condition changes, i.e. against changes in the temperature and in the integrated circuit supply voltage.

It is observed that the soft-programming problem also affects the memory cells MC in the memory sectors MS (as well as the redundant memory cells RMC in the memory normal and redundant memory sectors MS and RMS), and also in that case care needs to be used not to stress the drains of the memory cells' floating gate MOS transistors. However, the storage MOS transistors CMC1, CMC2 in the CAM array 120 may be more prone to the soft-programming problem because they may remain selected, and thus stressed, for relatively long times, possibly even for the whole time the memory device integrated circuit is kept on; this is for example the case of the CAM cells intended to store memory device configuration parameters, which belong to one or more CAM word lines that are kept selected for substantially all the time the memory device is powered, or CAM cells intended to store the address(es) of the defective memory sector(s); CAM cells that are intended to store addresses of defective storage resources within a given memory sector belong to CAM word lines that are kept selected as long as the corresponding memory sector is accessed (for these CAM cells, a shared CAM latch scheme can be exploited).

Conventionally, the biasing voltage that, through the biasing voltage line Vb, biases the transistors Q1 and Q2 is generated by means of a voltage partition from an initially higher voltage, which can be the supply voltage VDD of the memory device integrated circuit, or an internally-generated higher voltage generated by an on-chip charge-pump voltage booster, using a resistive voltage partitioner made up of a certain number diode-connected P-channel and N-channel MOSFETs connected in series to each other (the specific number depending on several parameters such as the initial voltage, the target biasing voltage, the MOSFETs' threshold voltage and so on).

One such solution, in addition to being rather power consuming (a crowbar current flows through the voltage partitioner), has a very limited precision and does not guarantee that the biasing voltage is sufficiently stable, depending on process parameters such as the MOSFETs threshold voltages, and there is no control on the voltage thus generated. In particular, no control is exercised on the threshold voltage of the biasing MOSFETs Q1 and Q2.

This limited stability and predictability of the biasing voltage, and thus of the drain voltage of the CAM storage MOS transistors CMC1 and CMC2, is very undesirable: if the drain voltage of these transistors rises too much, soft-programming becomes significant, while too low a drain voltage impairs the operation of the CAM latch 130, particularly the correct switching of the inverters INV1, INV2.

FIG. 2 shows schematically a bias voltage generator according to an embodiment of the present invention, adapted to overcome the above-mentioned problems. The bias voltage generator, identified globally by 200, includes a circuit branch comprising a MOSFET Qx and, in series thereto, a current generator Ix, connected between the supply voltage VDD of the memory device integrated circuit and the ground GND. The MOSFET Qx is similar or, preferably, substantially identical to the bias MOSFETs Q1 and Q2 that control the drain voltage of the CAM cell storage transistors CMC1, CMC2.

The circuit branch, particularly the gate of the MOSFET Qx is controlled by a differential structure configured as a voltage follower: a differential amplifier 205, of sufficiently high gain (e.g. an operational amplifier) has a non-inverting ("+") input connected to a voltage generator Vdrain, generating a voltage Vdrain substantially equal to the target voltage for the drain of the CAM cell storage transistors CMC1, CMC2; an inverting ("−") input of the differential amplifier 205 is connected, through a feedback network (in the shown example, a simple short-circuit) to a source of the MOSFET Qx; an output O of the differential amplifier 205 is connected to and controls the MOSFET Qx, and to the biasing voltage line Vb. The differential amplifier 205 receives, as voltage supply, a voltage Vcp generated for example by a charge pump voltage booster 210 of the memory device (but this is not a limitation to the present invention).

Thanks to this circuit arrangement, and provided that the gain of the differential amplifier 205 (inserted in a negative feedback loop) is sufficiently high, the biasing voltage Vb that, through the biasing voltage line Vb, biases the gate of the biasing MOSFETs Q1 and Q2, is such that a voltage Vx at a source node of the MOSFET Qx is:

Vx=Vdrain, because the non-inverting input of the differential amplifier 205 behaves as a "virtual" ground and the circuit, by controlling the drive of the MOSFET Qx, and thus the voltage drop thereacross caused by the current Ix, tends to keep the differential amplifier inverting input "+" substantially at the same potential as the non-inverting input "−".

Since the MOSFET Qx is substantially identical to the bias MOSFETs Q1 and Q2 (in particular, it has substantially the same threshold voltage), which are driven by the same gate voltage Vb as the MOSFET Qx, the voltage at the source electrodes of the MOSFETs Q1 and Q2 is substantially identical to the voltage Vx at the drain of the MOSFET Qx, and thus to the target value Vdrain.

In this way, it is possible to precisely control the drain voltage of the CAM cell storage MOS transistors CMC1, CMC2, and that voltage is independent from the threshold voltage of the biasing MOSFETs Q1, Q2. Additionally, the drain voltage of the CAM cell storage MOS transistors CMC1, CMC2 is stable against variations in the operating conditions, to the extent that the voltage Vdrain generated by the voltage generator Vdrain is stable.

Figure 3:
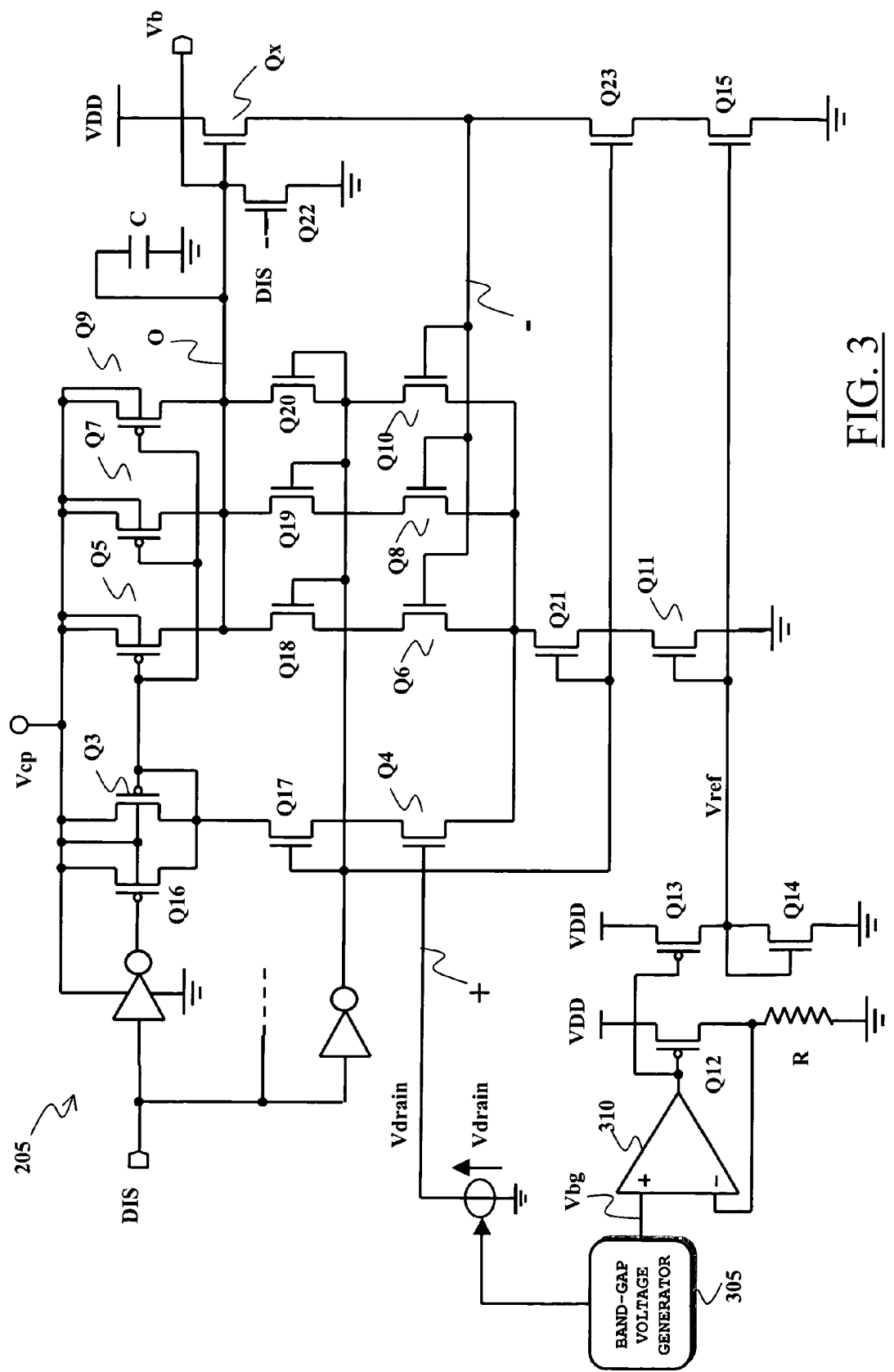
FIG. 3 is a detailed circuit diagram of the biasing structure of FIG. 2, according to one embodiment of the present invention.

FIG. 3 is a detailed circuit diagram of the biasing voltage generator shown schematically in FIG. 2, in one embodiment of the present invention.

In particular, the differential amplifier 205 includes one circuit branch in correspondence of the non-inverting input + and a plurality (three in the example) of circuit branches connected in parallel in correspondence of the inverting input −. The circuit branch in correspondence of the non-inverting input + comprises a series of a P-channel MOSFET Q3 and an N-channel MOSFET Q4, wherein the MOSFET Q3 is diode-connected and the MOSFET Q4 is driven by the voltage Vdrain fed at the non-inverting input +. Each one of the three circuit branches corresponding to the inverting input − includes a series connection of a respective P-channel MOSFET Q5, Q7, Q9, in current-mirror configuration with the MOSFET Q3, and a respective N-channel MOSFET Q6, Q8, Q10, all driven by the voltage at the inverting input −, i.e. by the voltage Vx at the drain of the MOSFET Qx.

The MOSFETs in the four circuit branches of the differential amplifier are biased by a current generated by an N-channel MOSFET Q11 with drain coupled to the source electrodes of the MOSFETs Q4, Q6, Q8 and Q10, source connected to ground and gate biased by a bias voltage Vref, distributed through a reference voltage line Vref.

The reference voltage Vref is for example generated by means of a band-gap reference voltage generator 305 generating a stable band-gap reference voltage Vbg; the band-gap reference voltage Vbg is supplied to a non-inverting input of a differential amplifier 310 controlling a P-channel MOSFET Q12 appended to the supply voltage VDD and in series to a resistor R connected to ground. The drain terminal of the MOSFET Q12 is connected to the inverting input of the differential amplifier 310. The output of the differential amplifier 310 also controls another P-channel MOSFET Q13, in a circuit branch parallel to that containing the MOSFET Q12 and the resistor R, and wherein a diode-connected N-channel MOSFET Q14 is connected in series to the MOSFET Q13. The voltage Vref corresponds to the voltage at the drain of the MOSFET Q14.

The voltage Vdrain that, in the schematic diagram of FIG. 2, is generated by the voltage generator Vdrain is generated in a way similar to the reference voltage Vref, although other voltage generation schemes are possible.

The current generator Ix appearing in the schematic diagram of FIG. 2 is for example implemented by means of an N-channel MOSFET Q15, controlled by the reference voltage Vref.

In addition, circuit elements are provided in FIG. 3, which were not shown in the schematic diagram of FIG. 2, adapted to enable/disable the biasing voltage generator, responsive to an enable/disable signal DIS, controlled for example by a control circuit of the memory device. In particular, a P-channel MOSFET Q16, controlled by a logic complement of the signal DIS (and thus off when the biasing voltage generator is enabled), is connected in parallel to the MOSFET Q3; an N-channel MOSFET Q17, Q18, Q19 and Q20, controlled by logic complement of the signal DIS (and thus on when the biasing voltage generator is enabled), is inserted in each circuit branch of the differential amplifier, in series with the respective P-channel MOSFET Q3, Q5, Q7, Q9. An N-channel MOSFET Q21, controlled by the logic complement of the signal DIS (and thus on when the biasing voltage generator is enabled) is inserted in series with the MOSFET Q11. An N-channel MOSFET Q22, controlled by the signal DIS (and thus off when the biasing voltage generator is enabled) has drain connected to the output O of the differential amplifier 205, and source connected to ground. Finally, an N-channel MOSFET Q23, controlled by the logic complement of the signal DIS (and thus on when the biasing voltage generator is enabled) is inserted in series with the MOSFET Qx.

It can be appreciated that the differential amplifier 205 has an unbalanced architecture, causing a higher fraction of the bias current, generated by the MOSFET Q11, to be deviated into the parallely-connected circuit branches corresponding to the inverting input −, while a lower current fraction flows in the branch corresponding to the non-inverting input +; this allows reducing the power-on time of the biasing voltage generator circuit, by shortening the settling time of the voltage Vb.

A capacitor C connected between the output O and the ground renders the voltage Vb stable during the switching of the CAM (change of CAM word line).

It is pointed out that the circuit structure depicted in FIG. 3 is merely exemplary and not at all limitative. For example, it is sufficient that the differential amplifier 205 receives as a supply voltage a voltage higher than the target biasing voltage Vb.

Figure 4:
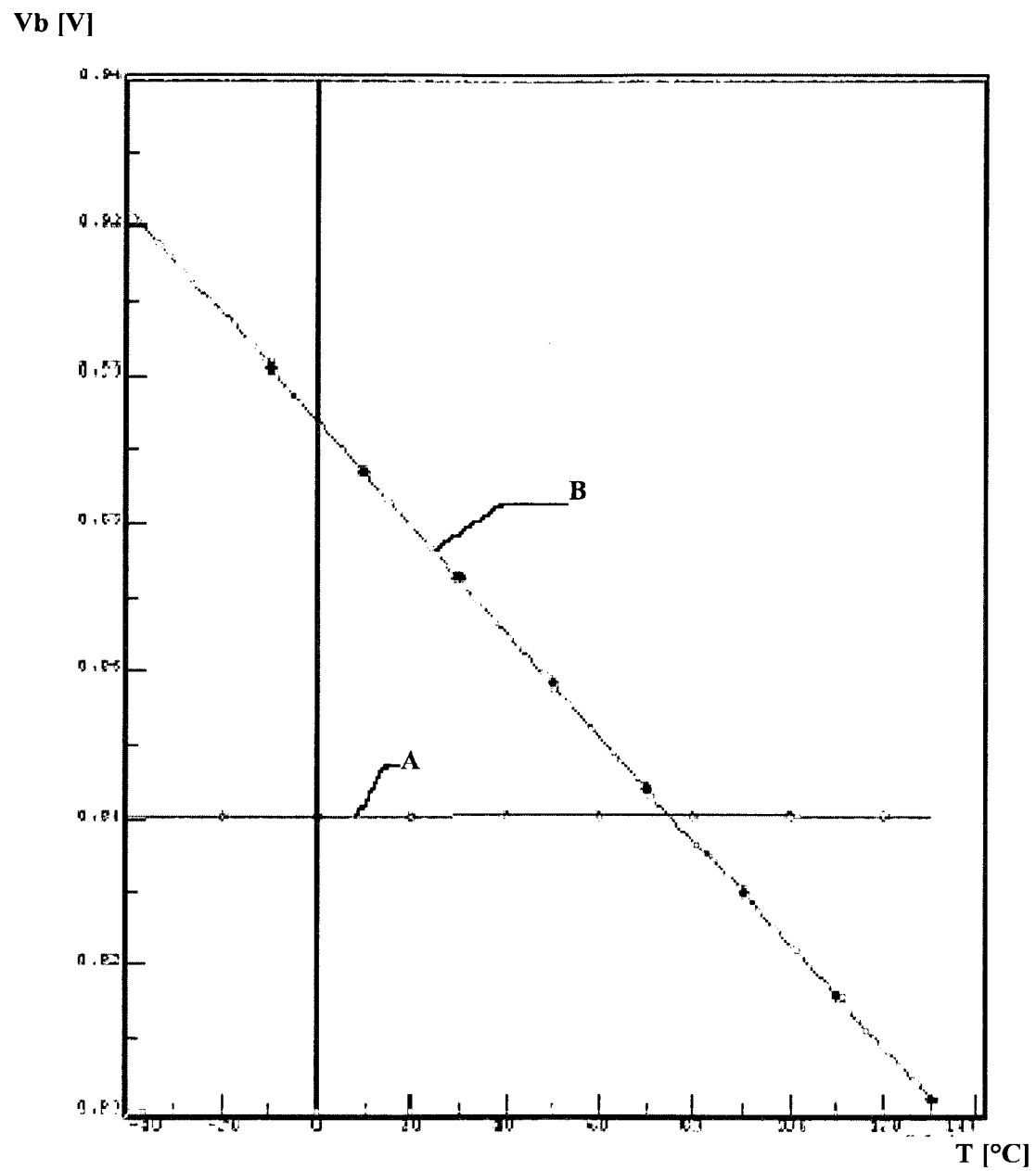
FIG. 4 is a diagram showing the results of simulations conducted on the biasing structure shown in FIGS. 2 and 3 according to an embodiment of the invention, compared to a conventional biasing structure.

In FIG. 4 there are presented the results of simulations conducted on a biasing voltage generator structure of the type depicted in FIG. 3, compared to a conventional biasing voltage generator, consisting of a voltage partitioner. In particular, the variation in the biasing voltage Vb (in ordinate, unit: Volts) as a function of the operating temperature (in abscissa, unit: ° C.) in the two cases is presented. It can be appreciated that while the biasing voltage generator according to the described embodiment of the present invention ensures that the voltage Vb is stable and does not substantially vary (curve A), the biasing voltage generated by the conventional biasing voltage generator (curve B) greatly varies with the temperature, with all the negative consequences that have been outlined in the foregoing.

Thus, thanks to the biasing voltage generator according to an embodiment of the present invention, it is possible to generate a stable biasing voltage for controlling the transistors that bias the drain electrodes of the CAM cell storage transistors; the drain voltage of the CAM cell storage transistors is thus rendered stable and predictable in turn, and this reduces the problems of drain stress, and consequently the risk of soft-programming, that where instead encountered in the art.

It is pointed out that albeit described making reference to the biasing of CAM cell storage transistors, the invention is not limited to this case, being applicable in general whenever it is necessary to control a voltage corresponding to an electrode of a storage transistors, and in particular in the case of memory cells in a memory cell array, such as the memory cells MC within the memory sector MS.

Even more generally, the biasing structure can be exploited in connection with any kind of memory cell, either programmable or not.

Referring again to FIGS. 1 and 2, the memory 100, which includes the biasing voltage generator 200, may be incorporated in an electronic system such as a computer system.

Finally, it is underlined that although the present invention has been disclosed and described by way of some embodiments, it is apparent to those skilled in the art that several modifications to the described embodiments, as well as other embodiments of the present invention are possible without departing from the scope thereof.

What is claimed is:

1. A biasing structure for a memory cell storage element, for setting an operating voltage at an accession electrode of the memory cell storage element, comprising:
    a biasing transistor coupled to the accession electrode and adapted to set the operating voltage based on a biasing voltage received at a control electrode of the biasing transistor, and
    a biasing voltage generator for generating the biasing voltage, wherein
    the biasing voltage generator includes a feedback voltage regulation structure adapted to track changes in a threshold voltage of the biasing transistor, so as to keep the operating voltage at the accession electrode of the memory cell storage element substantially stable against operating condition changes.

2. The biasing structure according to claim 1, in which the feedback voltage regulation structure of the biasing voltage generator includes an emulation transistor of electrical characteristics correspondent to those of the biasing transistor, inserted in a feedback control loop.

3. The biasing structure according to claim 2, in which the feedback voltage regulation structure includes a voltage follower structure.

4. The biasing structure according to claim 3, in which the voltage follower structure includes a differential amplifier having a non-inverting input receiving a target voltage corresponding to the operating voltage to be set at the accession electrode of the storage element, an output controlling the emulation transistor, and an inverting input connected to an electrode of the emulation transistor corresponding to the electrode of the biasing transistor coupled to the accession electrode.

5. The biasing structure according to claim 4, in which the emulation transistor is inserted in a circuit branch in series with a reference current generator.

6. The biasing structure according to claim 5, in which said reference current generator includes a MOSFET biased by a reference voltage generated starting from a band-gap reference voltage.

7. The biasing structure according to claim 4, in which the differential amplifier has a non-inverting input circuit and an inverting input circuit, and a bias current generator generating a bias current for the non-inverting and the inverting input circuits, wherein the non-inverting and the inverting input circuits are unbalanced such that a higher fraction of the bias current flows through the inverting input circuit.

8. A content addressable memory, comprising at least one content-addressable memory cell including at least one storage transistor having an accession electrode, and a biasing structure according to claim 1, for setting an operating voltage at the accession electrode of the content-addressable memory cell storage transistor.

9. A semiconductor memory including a biasing structure according to claim 1.

10. A method of biasing a memory cell storage element, for setting an operating voltage at an accession electrode of the memory cell storage element, comprising:
    generating a biasing voltage, and
    feeding the biasing voltage to a control electrode of a biasing transistor coupled to the accession electrode and adapted to set the operating voltage based on the biasing voltage, wherein
    said generating the biasing voltage includes tracking changes in a threshold voltage of the biasing transistor, so as to keep the operating voltage at the accession electrode of the memory cell storage element substantially stable against operating condition changes.

11. A circuit for biasing a node of a memory cell, the circuit comprising:
    a first transistor having a drive node coupled to the node of the memory cell and having a control node; and
    a bias generator having an output node coupled to the control node of the transistor and operable to generate on the output node a bias signal that causes the transistor to substantially maintain a predetermined signal level at the node of the memory cell.

12. The circuit of claim 11 wherein:
    the first transistor comprises an insulated-gate field-effect transistor;
    the drive node of the transistor comprises a drain of the transistor; and
    the control node of the transistor comprises a gate of the transistor.

13. The circuit of claim 11 wherein the bias generator comprises:
    a second transistor having a control node coupled to the control node of the first transistor and having a drive node; and an amplifier coupled to the control node of the second transistor and operable to maintain the predetermined signal level at the drive node of the second transistor.

14. The circuit of claim 11 wherein:
the first transistor responds to an environmental condition in a manner; and
the bias generator comprises,
a second transistor having a control node coupled to the control node of the first transistor and having a drive node, the second transistor responding to the environmental condition in substantially the same manner, and
an amplifier coupled to the control node of the second transistor and operable to maintain the predetermined signal level at the drive node of the second transistor.

15. The circuit of claim 11 wherein:
the first transistor has a first threshold voltage that responds to an environmental condition in a manner; and
the bias generator comprises,
a second transistor having a control node coupled to the control node of the first transistor, having a drive node, and having a second threshold voltage that responds to the environmental condition in substantially the same manner, and
an amplifier coupled to the control node of the second transistor and operable to maintain the predetermined signal level at the drive node of the second transistor.

16. The circuit of claim 11 wherein the bias generator comprises:
a second transistor having a control node coupled to the control node of the first transistor and having a drive node; and
a differential amplifier having a first input node operable to receive a reference signal, a second input node coupled to the drive node of the second transistor, and an output node coupled to the control node of the second transistor and operable to maintain the predetermined signal level at the drive node of the second transistor.

17. The circuit of claim 11 wherein the bias generator comprises:
a second transistor having a control node coupled to the control node of the first transistor and having a drive node; and
a differential amplifier having a first input node operable to receive the predetermined signal level, a second input node coupled to the drive node of the second transistor and being unbalanced relative to the first input node, and an output node coupled to the control node of the second transistor and operable to maintain the predetermined signal level at the drive node of the second transistor.

18. The circuit of claim 11 wherein the bias generator comprises:
a second transistor having a control node coupled to the control node of the first transistor and having a drive node;
a current source coupled to the drive node of the second transistor; and
an amplifier coupled to the control node of the second transistor and operable to maintain the predetermined signal level at the drive node of the second transistor.

19. An integrated circuit, comprising:
a memory cell having a node; and
a circuit for biasing the node of a memory cell, the circuit comprising, a first transistor having a first drive node coupled to the node of the memory cell and having a control node, and
a bias generator having an output node coupled to the control node of the transistor and operable to generate on the output node a bias signal that causes the transistor to substantially maintain a predetermined signal level at the node of the memory cell.

20. The integrated circuit of claim 19 wherein the memory cell comprises a nonvolatile memory cell.

21. The integrated circuit of claim 19 wherein the node comprises a data-access node.

22. The integrated circuit of claim 19, further comprising:
wherein the transistor has a second drive node; and
a sense amplifier coupled to the second drive node of the transistor and operable to generate a signal that identifies data stored in the memory cell.

23. The integrated circuit of claim 19, further comprising a content addressable memory that includes the memory cell.

24. An electronic system, comprising:
an integrated circuit, comprising,
a memory cell having a node, and
a circuit for biasing the node of a memory cell, the circuit comprising,
a first transistor having a first drive node coupled to the node of the memory cell and having a control node, and
a bias generator having an output node coupled to the control node of the transistor and operable to generate on the output node a bias signal that causes the transistor to substantially maintain a predetermined signal level at the node of the memory cell.

25. A method, comprising:
driving a node of a memory cell with a first transistor having a control node; and
driving the control node with a bias signal such that the transistor substantially maintains a predetermined signal level at the node of the memory cell.

26. The method of claim 25, further comprising tracking the bias signal to an operating parameter of the transistor.

27. The method of claim 25, further comprising tracking the bias signal to a gate-to-source threshold voltage of the transistor.

28. The method of claim 25, further comprising:
driving a control node of a second transistor with the bias signal, the second transistor having substantially the same structure as the first transistor;
comparing a signal level at a drive node of the second transistor with a reference signal level; and
generating the bias signal such that the signal level at the drive node of the second transistor has a predetermined relationship to the reference signal level.

29. The method of claim 25, further comprising:
wherein the bias signal comprises a bias voltage;
driving a control node of a second transistor with the bias voltage, the second transistor having substantially the same structure as the first transistor;
comparing a voltage at a drive node of the second transistor with a reference voltage; and
generating the bias voltage such that the voltage at the drive node of the second transistor substantially equals the reference voltage.

* * * * *

UNITED STATES PATENT AND TRADEMARK OFFICE
CERTIFICATE OF CORRECTION

PATENT NO. : 7,321,516 B2  
APPLICATION NO. : 11/063651  
DATED : January 22, 2008  
INVENTOR(S) : Alberto Jose Di Martino et al.

Page 1 of 1

It is certified that error appears in the above-identified patent and that said Letters Patent is hereby corrected as shown below:

On the Title Page, Assignees Item (73) add STMicroelectronics, S.A. as second assignee Signed and Sealed this
Sixteenth Day of October, 2012

David J. Kappos
*Director of the United States Patent and Trademark Office*